United States Patent
Tu et al.

(10) Patent No.: US 9,054,129 B1
(45) Date of Patent: Jun. 9, 2015

(54) SEMICONDUCTOR DEVICE AND METHOD FOR MANUFACTURING THE SAME

(71) Applicant: Vanguard International Semiconductor Corporation, Hsinchu (TW)

(72) Inventors: Shang-Hui Tu, Jhubei (TW); Chih-Jen Huang, Dongshan Township (TW); Jui-Chun Chang, Hsinchu (TW); Yu-Hao Ho, Keelung (TW); Wen-Hsin Lin, Jhubei (TW); Shin-Cheng Lin, Tainan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 14/225,943

(22) Filed: Mar. 26, 2014

(51) Int. Cl.
*H01L 23/62* (2006.01)
*H01L 29/66* (2006.01)

(52) U.S. Cl.
CPC .................... *H01L 29/6659* (2013.01)

(58) Field of Classification Search
None
See application file for complete search history.

(56) References Cited

U.S. PATENT DOCUMENTS

2009/0114957 A1* 5/2009 Hwang .................... 257/288

* cited by examiner

*Primary Examiner* — Jack Chen
(74) *Attorney, Agent, or Firm* — Birch Stewart Kolasch & Birch, LLP

(57) ABSTRACT

The present disclosure provides a semiconductor device, including a semiconductor substrate, an epitaxial structure, a well region, a drain region and a source region respectively formed in the epitaxial structure inside and outside of the well region. At least one set of first, second and third heavily doped regions formed in the well region between source and drain regions, wherein the first, second and third heavily doped regions are adjoined sequentially from bottom to top. A gate structure disposed over the epitaxial structure. The present disclosure also provides a method for manufacturing the semiconductor device.

13 Claims, 9 Drawing Sheets

SEMICONDUCTOR DEVICE AND METHOD FOR MANUFACTURING THE SAME

BACKGROUND

1. Technical Field

The disclosure relates to a semiconductor device, and in particular to a semiconductor device having a super junction structure and a method for manufacturing the same.

2. Description of the Related Art

Semiconductor devices, such as high-voltage elements, are typically divided into: vertical double-diffused metal-oxide-semiconductor field effect transistors (VDMOSFETs) and laterally diffused metal-oxide-semiconductor field effect transistors (LDMOSFETs). In order to increase the withstand voltage of the described high-voltage elements, the doping concentration of the deep well region (also referred to as the drift region) is reduced, the depth of the drift region is increased, or the length of the isolation structure (also referred to as the field oxide layer) underlying the gate is increased.

FIG. 1 is a cross section of a conventional n-type LDMOSFET. The n-type LDMOSFET 10 includes a p-type semiconductor substrate 100 and a p-type epitaxial layer 102 thereon. A gate structure 116 and a field oxide layer 114 are on the p-type epitaxial layer 102. Moreover, a p-type body region 106 and an n-type drift region 104 are respectively in the p-type epitaxial layer 102 on both sides of the gate structure 116, wherein the n-type drift region 104 further extends into the underlying p-type semiconductor substrate 100.

A p-type contact region 108 and an adjacent n-type contact region 110 (both also referred to as a source region) are in the body region 106 and an n-type contact region 112 (also referred to as a drain region) is in the drift region 104. Moreover, a source electrode 117 is electrically connected to the p-type contact region 108 and the n-type contact region 110. A drain electrode 119 is electrically connected to the n-type contact region 112. A gate electrode 121 is electrically connected to the gate structure 116.

As mentioned above, in order to improve the withstand voltage of the transistor 10, the doping concentration of the drift region 104 has to be reduced and/or the length of the field oxide layer 114 underlying the gate structure 116 has to be increased. However, when the withstand voltage is increased by the described means, the on-resistance (Ron) or the size of the transistor 10 is also increased. In addition, if the current in the drift region 104 is excessively concentrated in one place, the semiconductor device would be damaged.

Thus, there exists a need in the art for development of a semiconductor device, capable of increasing the withstand voltage while preventing the on-resistance from increasing. In addition, the semiconductor device may prevent the current in the drift region from being excessively concentrated in one place, which in turn prevents the semiconductor device from being damaged.

SUMMARY

The present disclosure provides a semiconductor device, including: a semiconductor substrate having a first conductivity type; an epitaxial structure of the first conductivity type disposed over the semiconductor substrate; a well region of a second conductivity type formed in the epitaxial structure and the semiconductor substrate, wherein the second conductivity type is opposite to the first conductivity type; a drain region and a source region respectively formed in the epitaxial structure inside and outside of the well region. At least one set of first, second and third heavily doped regions formed in the well region between source and drain regions, wherein the first, second and third heavily doped regions are adjoined sequentially from bottom to top and the second heavily doped region has a doping concentration greater than that of the well region, and the first and third heavily doped regions have a doping concentration similar to that of the well region, wherein the second heavily doped region has the first conductivity type, while the first and third heavily doped regions have the second conductivity type. A gate structure disposed over the epitaxial structure.

The present disclosure also provides a method for manufacturing a semiconductor device, including: providing a semiconductor substrate having a first conductivity type; forming an epitaxial structure of the first conductivity type over the semiconductor substrate; forming a well region of a second conductivity type in the epitaxial structure and the semiconductor substrate, wherein the second conductivity type is opposite to the first conductivity type; forming at least one set of first, second and third heavily doped regions in the well region between source and drain regions, wherein the first, second and third heavily doped regions are adjoined sequentially from bottom to top and the second heavily doped region has a doping concentration greater than that of the well region, and the first and third heavily doped regions have a doping concentration similar to that of the well region, wherein the second heavily doped region has the first conductivity type, while the first and third heavily doped regions have the second conductivity type; forming a drain region and a source region respectively in the epitaxial structure inside and outside of the well region, such that the set of first, second and third heavily doped regions is disposed in the well region between the drain region and the source region; and forming a gate structure over the epitaxial structure.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
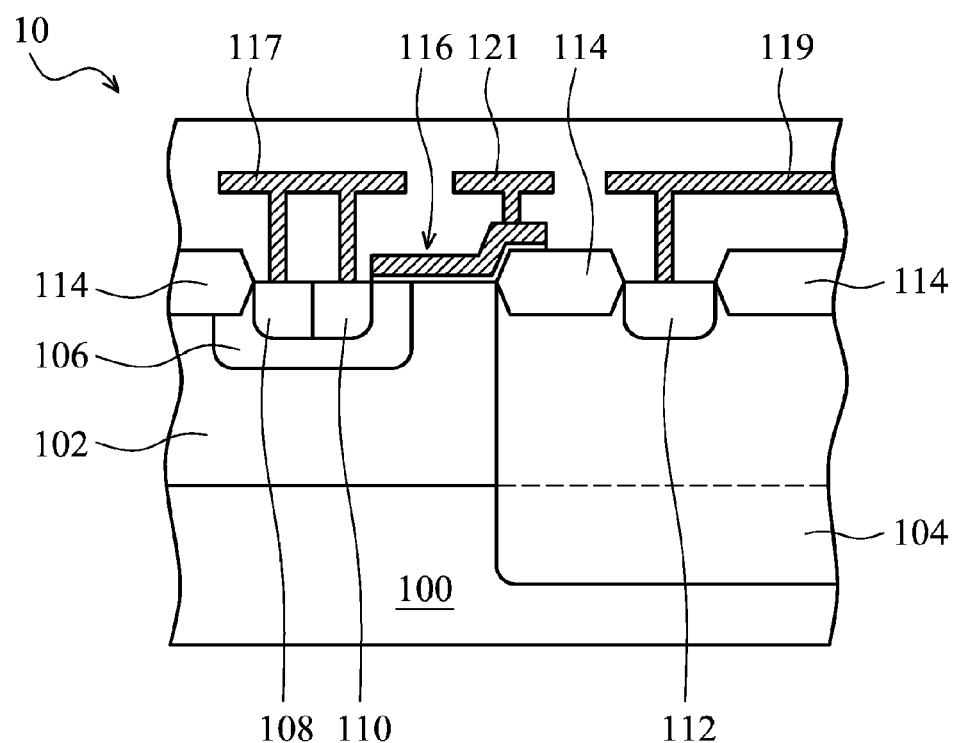
FIG. 1 is a cross section of a conventional n-type LDMOSFET.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2A:
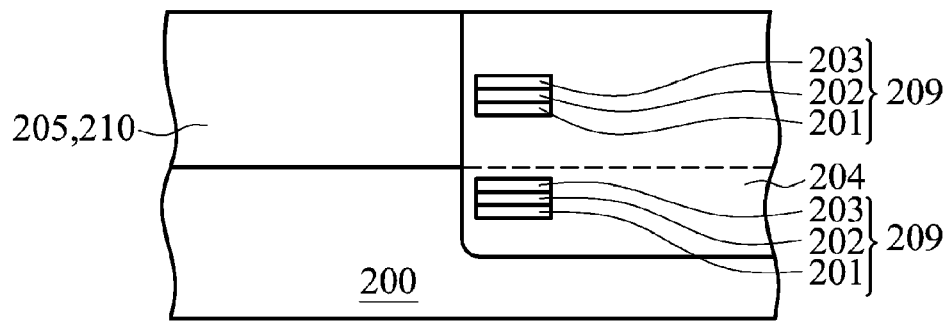
FIGS. 2A to 2G are cross sections of an exemplary embodiment of a method for fabricating a semiconductor device according to the invention.
Figure 2B:
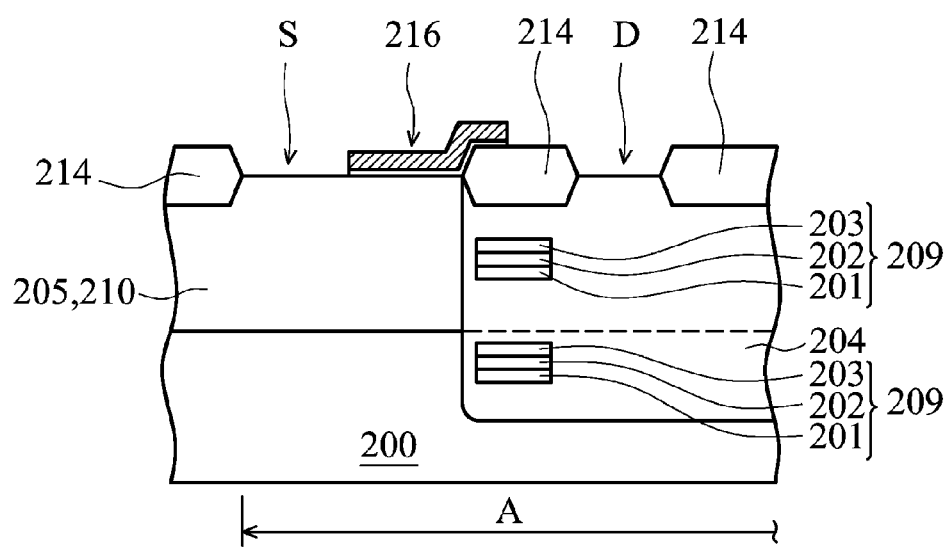
Figure 2C:
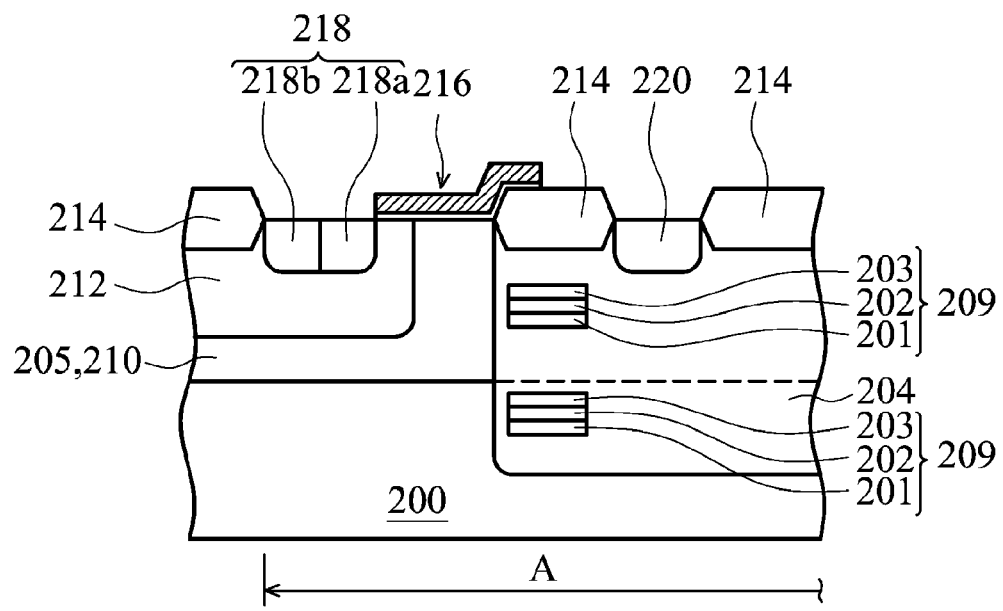
Figure 2D:
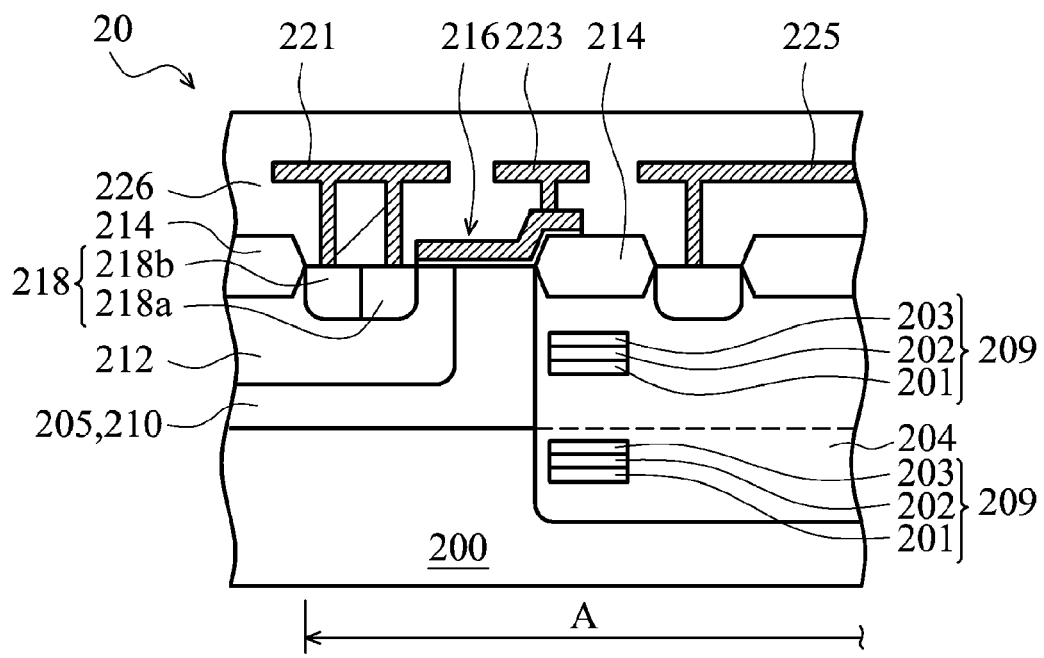

FIG. 2D illustrates a cross section of an exemplary embodiment of a semiconductor device 20 according to the invention. In the embodiment, the semiconductor device 20 may be a laterally diffused metal-oxide-semiconductor field effect transistor (LDMOSFET) having super junction structures. Moreover, the semiconductor device 20 may include a semiconductor substrate 200, such as a silicon substrate, silicon on insulator (SOI) substrate, or another suitable semiconductor substrate, of a first conductivity type.

An epitaxial structure 210 of the first conductivity type is formed on the semiconductor substrate 200. In the embodiment, the epitaxial structure 210 may be composed of a single epitaxial layer. A well region 204, a source region 218, a drain region 220 and a body region 212 may be formed in the epitaxial structure 210. For example, the well region 204 of a second conductivity type opposite to the first conductivity type extends into the semiconductor substrate 200 from the epitaxial structure 210, such that the well region 204 is formed in the epitaxial structure 210 and the semiconductor substrate 200. Moreover, the well region 204 corresponds to an active region A (which is defined by a portion of the isolation structure, such as the field oxide layer 214) of the semiconductor substrate 200 to serve as a drift region of the LDMOSFET.

The source region 218 may include a doped region 218a of the second conductivity type and a doped region 218b of the first conductivity type. The source region 218 is formed in the epitaxial structure 210 outside of the well region 204, such as an epitaxial layer 205, and corresponds to the active region A. Moreover, the body region 212 of the first conductivity type may be formed in the epitaxial structure 210 outside of the well region 204, such that the source region 218 is in the body region 212. The drain region 220 is composed of the doped region of the second conductivity type only. The drain region 220 is formed in the well region 204 of the epitaxial structure 210 and corresponds to the active region A.

Figure 2E:
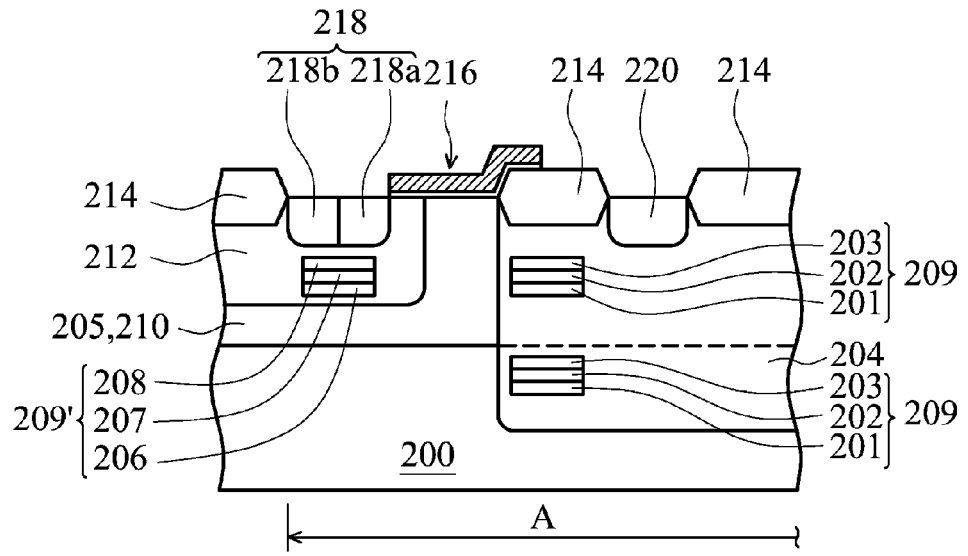

At least one set of the first heavily doped region 201, second heavily doped region 202 and third heavily doped region 203 is formed in the well region 204 between the drain region 220 and the source region 218, wherein the first heavily doped region 201, second heavily doped region 202 and third heavily doped region 203 are adjoined sequentially from bottom to top and the second heavily doped region 202 is electrically floating. The first heavily doped region 201, second heavily doped region 202 and third heavily doped region 203 are associated to serve as a heavily doped stack region 209. The second heavily doped region 202 has the first conductivity type, while the first and third heavily doped regions 201, 203 have the second conductivity type. The second heavily doped region 202 has a doping concentration greater than that of the well region 204, and the first and third heavily doped regions 201, 203 have a doping concentration similar to that of the well region 204 to form a super junction structure in the well region 204 of the epitaxial structure 210. In the embodiment, the first conductivity type is p-type and the second conductivity type is n-type. Alternatively, the first conductivity type is n-type and the second conductivity type is p-type. In addition, the field oxide layer 214 may be spaced apart from the heavily doped stack region 209. However, as shown in FIG. 2G, the heavily doped stack region 209 may directly contact the field oxide layer 214. In other words, the third heavily doped region 203 of the heavily doped stack region 209 most adjacent to the field oxide layer 214 may directly contact the field oxide layer 214.

In the embodiment, at least one set of the first, second and third heavily doped regions 201, 202 and 203 may be formed in the well region 204 of the epitaxial layer 205 (i.e., the epitaxial structure 210) and/or the semiconductor substrate 200. For example, the semiconductor device 20 may include two sets of the first, second and third heavily doped regions 201, 202 and 203 respectively formed in the well region 204 corresponding to the epitaxial layer 205 and corresponding to the semiconductor substrate 200. The two sets of the first, second and third heavily doped regions 201, 202 and 203 are two sets of the heavily doped stack region 209. As shown in FIG. 2D, the two sets of the first, second and third heavily doped regions 201, 202 and 203 substantially align with each other vertically and two super junction structures are formed in the epitaxial layer 205 and the semiconductor substrate 200. In addition, the two sets of the heavily doped stack region 209 are spaced apart from each other.

A gate structure 216 may be disposed on the epitaxial structure 210 and between the source region 218 and the drain region 220. The gate structure 216 typically includes a gate (e.g., a polysilicon gate), a gate dielectric layer underlying the gate and a field oxide layer 214 underlying the gate dielectric layer. The field oxide layer 214 may be spaced apart from the heavily doped stack region 209. However, as shown in FIG. 2G, the heavily doped stack region 209 may directly contact the field oxide layer 214. In other words, the third heavily doped region 203 of the heavily doped stack region 209 most adjacent to the field oxide layer 214 may directly contact the field oxide layer 214.

The semiconductor device 20 may further include an interlayer dielectric (ILD) layer 226 and a plurality of interconnect structures 221, 223 and 225 therein. In the embodiment, the interconnect structure 221 is electrically connected to the source region 218 to serve as a source electrode, the interconnect structure 223 is electrically connected to the gate structure 216 to serve as a gate electrode and the interconnect structure 225 is electrically connected to the drain region 220 to serve as a drain electrode.

Figure 2F:
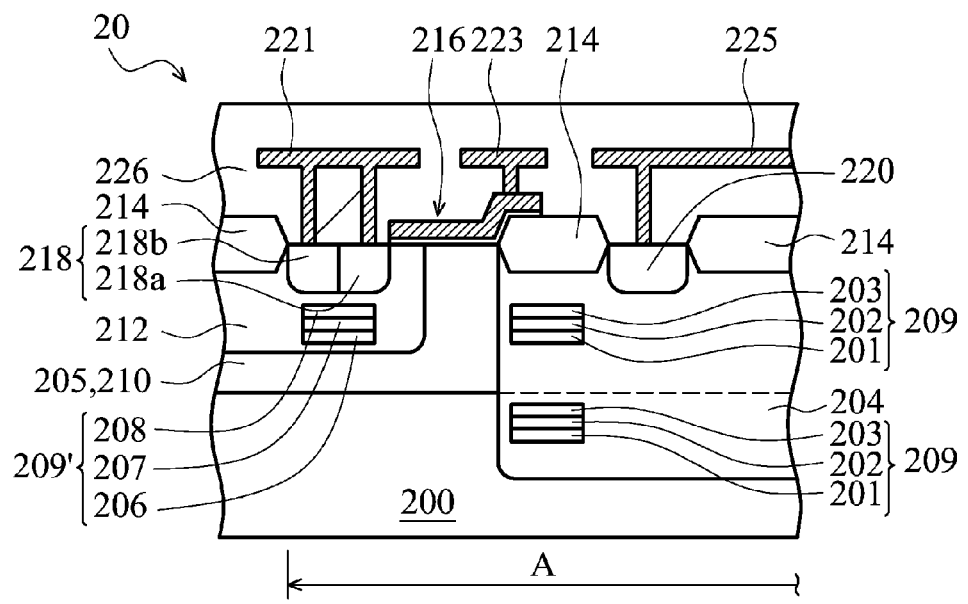
Figure 2G:
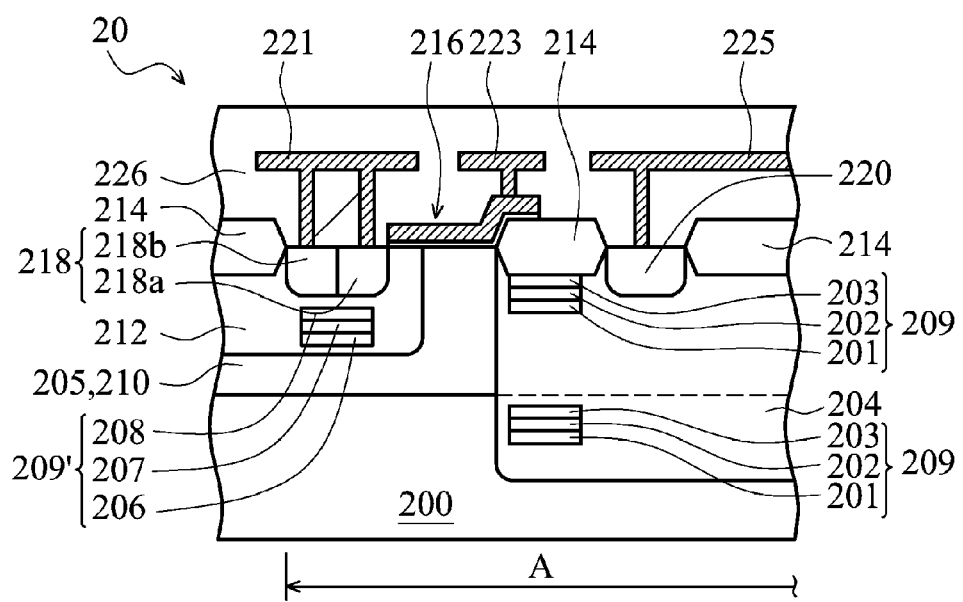

Referring to FIG. 2F, the semiconductor device 20 may further include a set of fourth, fifth and sixth heavily doped regions 206, 207 and 208 formed in the body region 212. The fourth, fifth and sixth heavily doped regions 206, 207 and 208 are adjoined sequentially from bottom to top. The fifth heavily doped region 207 has a doping concentration greater than that of the well region 204, and the fourth and sixth heavily doped regions 206 and 208 have a doping concentration similar to that of the well region 204. The fifth heavily doped region 207 has the first conductivity type, while the fourth and sixth heavily doped regions 206 and 208 have the second conductivity type. The fourth heavily doped region 206, fifth heavily doped region 207 and sixth heavily doped region 208 are associated to serve as a heavily doped stack region 209'. The first, second and third, fourth, fifth and/or sixth heavily doped regions 201-203 and 206-208 may have a rectangular shape.

Figure 3A:
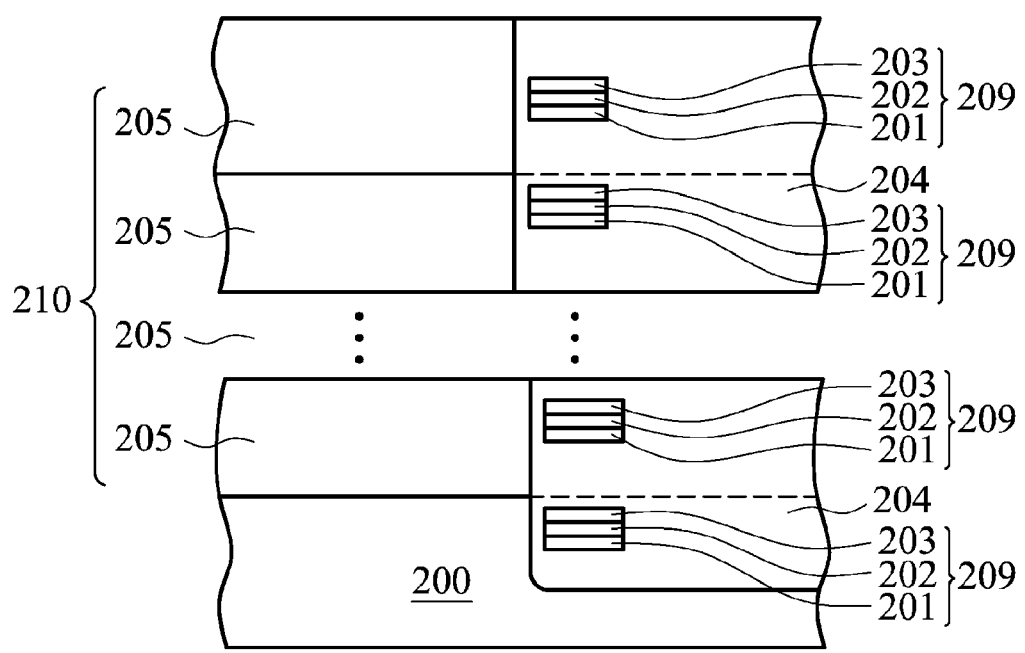
FIGS. 3A to 3D are cross sections of another exemplary embodiment of a method for fabricating a semiconductor device according to the invention.
Figure 3B:
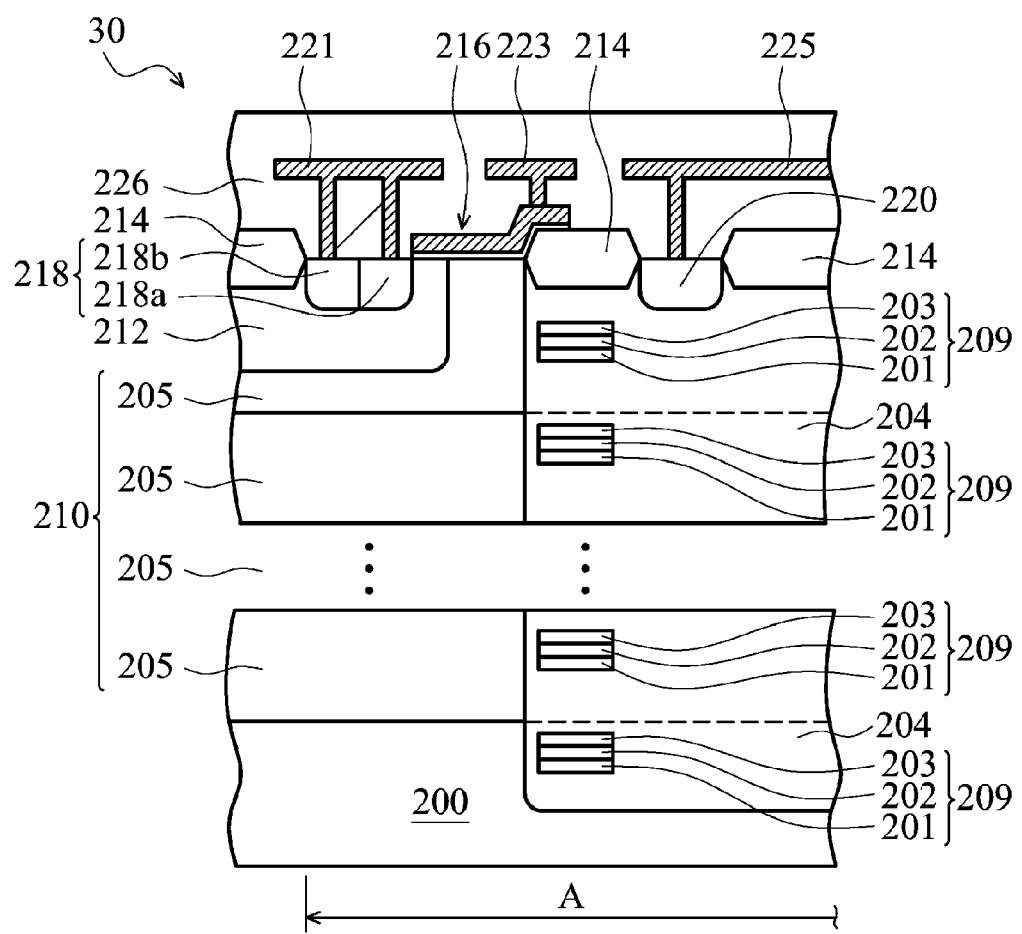

Referring to FIG. 3B, a cross section of another exemplary embodiment of a semiconductor device 30 according to the invention is shown. Elements in FIG. 3B that are the same as those in FIG. 2D are labeled with the same reference numbers as in FIG. 2D and are not described again for brevity. In the embodiment, the structure of the semiconductor device 30 is similar to that of the semiconductor device 20 (as shown in FIG. 2D). The difference is that the epitaxial structure 210 in the semiconductor device 30 includes a plurality of vertically stacked epitaxial layers 202. It is realized that the number of epitaxial layers 202 used is determined by the design demands and is not limited to the embodiment in FIG. 3B (i.e., the epitaxial layers 202 may be more than three layers). In the embodiment, the well region 204 extends into the underlying semiconductor substrate 200 from the epitaxial structure 210. Moreover, the source region 218, the drain region 220 and the body region 212 are formed in the uppermost epitaxial layer 205 of the epitaxial structure 210.

In one embodiment, the semiconductor device 30 includes at least one set of the first, second and third heavily doped regions 201, 202 and 203 formed in the well region 204 corresponding to the semiconductor substrate 200 or in the well region 204 corresponding to one of the epitaxial layers 205. In another embodiment, the semiconductor device 30 includes a plurality of sets of the first, second and third heavily doped regions 201, 202 and 203 formed in the well region 204 corresponding to each epitaxial layer 205 and the semiconductor substrate 200, as shown in FIG. 3. In addition, the plurality of the sets of the first heavily doped region 201, second heavily doped region 202 and third heavily doped region 203 forms a plurality of sets of heavily doped stack region 209. The heavily doped stack regions 209 are spaced apart from each other. It is realized that the number of sets of the first, second and third heavily doped regions 201, 202 and 203 may be less than or equal to the number of epitaxial layers 205, such that none of the first, second or third heavily doped regions 201, 202 and 203 is in the well region 204 corresponding to some of the epitaxial layers 205 and/or the semiconductor substrate 200. Compared with the embodiment in FIG. 2D, there may be more super junction structures in the embodiment in FIG. 3B.

Figure 3C:
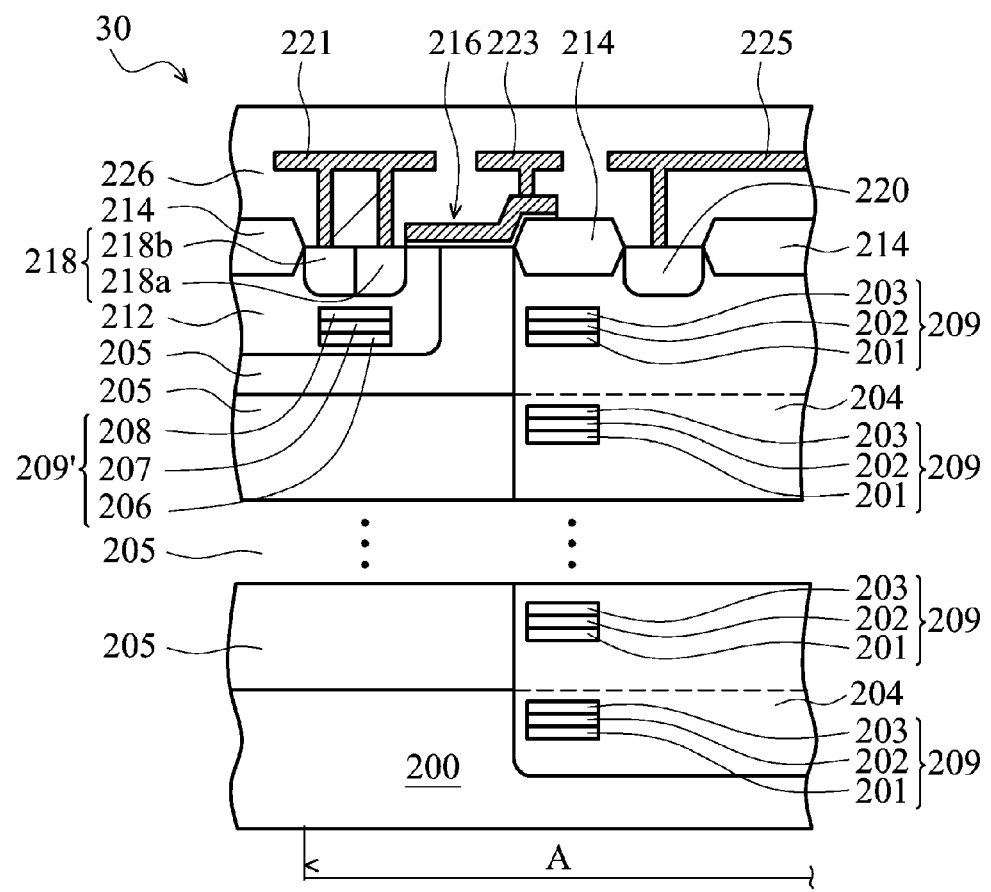

Referring to FIG. 3C, the semiconductor device 30 may further include a set of fourth, fifth and sixth heavily doped regions 206, 207 and 208 formed in the body region 212. The fourth, fifth and sixth heavily doped regions 206, 207 and 208 are adjoined sequentially from bottom to top. The fifth heavily doped region 207 has a doping concentration greater than that of the well region 204, and the fourth and sixth heavily doped regions 206 and 208 have a doping concentration similar to that of the well region 204. The fifth heavily doped region 207 has the first conductivity type, while the fourth and sixth heavily doped regions 206 and 208 have the second conductivity type. The fourth heavily doped region 206, fifth heavily doped region 207 and sixth heavily doped region 208 are associated to serve as a heavily doped stack region 209'. The first, second and third, fourth, fifth and/or sixth heavily doped regions 201-203 and 206-208 may have a rectangular shape.

In the foregoing embodiment, the heavily doped region of the first conductivity type and electrically floating in the super junction structure may help in the formation of a depletion region in the well region 204 (i.e., the drift region) thereby improving the withstand voltage of the LDMOSFET in the semiconductor device 20 or 30. Moreover, the heavily doped region of the second conductivity type in the super junction structure may provide an additional current path in the well region 204 (i.e., the drift region) to reduce the on-resistance between the source region and the drain region.

In addition, since the heavily doped regions of the second conductivity type are formed at two sides of the heavily doped region of the first conductivity type in the semiconductor device 20 or 30 of the embodiments, the semiconductor device 20 or 30 may provide more current paths compared to the semiconductor device having a heavily doped region of the second conductivity type formed at only one side of the heavily doped region of the first conductivity type. Therefore, the semiconductor device 20 or 30 of the embodiments may effectively distribute the current to prevent the current from being excessively concentrated in one portion of the drift region, which in turn prevents the semiconductor device from being damaged.

FIGS. 2A to 2D are cross sections of an exemplary embodiment of a method for fabricating a semiconductor device 20 according to the invention. Referring to FIG. 2A, a semiconductor substrate 200, such as a silicon substrate, a silicon on insulator (SOI) substrate or another suitable semiconductor substrate, of a first conductivity type is provided. Next, a well region 204 is formed in a predetermined region (i.e., an active region A) of the semiconductor substrate 200 sequentially by a doping process (e.g., ion implantation), and a thermal diffusion process.

Afterwards, an epitaxial structure 210 of the first conductivity type is formed on the semiconductor substrate 200. In the embodiment, the epitaxial structure 210 is composed of a single layer. For example, the epitaxial structure 210 is composed of an epitaxial layer 205. After forming the epitaxial layer 205 (i.e., the epitaxial structure 210) by an epitaxial growth process, the doping process (e.g., ion implantation), and the thermal diffusion process are sequentially performed in the epitaxial structure 210 corresponding to the active region A, such that the well region 204 in the semiconductor substrate 200 extends into the epitaxial structure 210, wherein the well region 204 of a second conductivity type different from the first conductivity type is configured to serve as a drift region of a subsequently formed LDMOSFET. In other embodiments, the well region 204 may be formed by other fabricating methods. For example, U.S. Pat. No. 7,682,955, disclosing a method for forming a deep well of a power device, is incorporated herein as reference.

In the embodiment, at least one set of the first, second and third heavily doped regions 201, 202 and 203 is formed in the well region 204, wherein the first heavily doped region 201, second heavily doped region 202 and third heavily doped region 203 are adjoined sequentially from bottom to top. The second heavily doped region 202 has the first conductivity type, while the first and third heavily doped regions 201, 203 have the second conductivity type. The second heavily doped region 202 has a doping concentration greater than that of the well region 204, and the first and third heavily doped regions 201, 203 have a doping concentration similar to that of the well region 204 to form a super junction structure in the well region 204 of the epitaxial structure 210. For example, after forming the well region 204 in the epitaxial structure 210 (i.e., the epitaxial layer 205), one set of the first, second and third heavily doped regions 201, 202 and 203 is formed in the well region 204 of the epitaxial layer 205 by a doping process, such as ion implantation.

In another embodiment, one set of the first, second and third heavily doped regions 201, 202 and 203 is formed in the well region 204 of the semiconductor substrate 200 before forming the epitaxial layer 205. Next, another set of the first, second and third heavily doped regions 201, 202 and 203 is formed in the well region 204 of the epitaxial layer 205 after forming the epitaxial layer 205 and a well region 204 therein, as shown in FIG. 2A. These two sets of first and second heavily doped regions 201 and 203 substantially and vertically align with each other to form two super junction structures in the epitaxial layer 205 and the semiconductor substrate 200. In addition, the two sets of the first, second and third heavily doped regions 201, 202 and 203 form two sets of heavily doped stack regions 209. The two sets of heavily doped stack regions 209 are spaced apart from each other.

In the foregoing embodiment, the first, second and third heavily doped regions 201, 202 and 203 are between a drain region 220 and a source region 218 (as shown in FIG. 2C) that are subsequently formed, wherein the second heavily doped region 202 is electrically floating. In the embodiment, the first conductivity type is p-type and the second conductivity type is n-type. Alternatively, in another embodiment, the first conductivity type is n-type and the second conductivity type is p-type.

Referring to FIGS. 2B and 2C, a plurality of isolation structures, such as a field oxide layer 214, may be formed on the epitaxial structure 210 by the conventional MOS process, wherein the active region A is defined by a portion of the field oxide layer 214 and a drain region D to be formed in the well region 204 is defined by the rest of the field oxide layer 214. Afterwards, a gate structure 216 is formed on the epitaxial structure 210 to define a source region S to be formed in the active region A outside of the well region 204, as shown in FIG. 2B. The field oxide layer 214 may be spaced apart from the heavily doped stack region 209. However, as shown in FIG. 2G, the heavily doped stack region 209 may directly contact the field oxide layer 214. In other words, the third heavily doped region 203 of the heavily doped stack region 209 most adjacent to the field oxide layer 214 may directly contact the field oxide layer 214.

Next, a body region 212 of the first conductivity type is optionally formed in the epitaxial structure 210 outside of the well region 204 sequentially by a doping process (e.g., ion implantation), and a thermal diffusion process, such that the subsequently formed source region 218 is in the body region 212. A doped region 218a of the second conductivity type is then formed in the predetermined source region S (as shown in FIG. 2B) and another doped region (i.e., the drain region 220) of the second conductivity type is formed in the predetermined drain region D (as shown in FIG. 2B) by a doping process (e.g., ion implantation). Afterwards, a doped region 218b of the first conductivity type is formed in the predetermined source region S (as shown in FIG. 2B) and adjacent to the doped region 218a, such that the doped region 218b and the doped region 218a form a source region 218, as shown in FIG. 2C.

In other embodiments, the doped region 218b may be formed before forming the doped region 218a and the drain region 220. In the embodiment, the doped region 218, the gate structure 216, the drain region 220 and the well region 204 having the super junction structures form an LDMOSFET.

Referring to FIG. 2D, an interlayer dielectric layer 226 and a plurality of interconnect structures 221, 223 and 225 therein are formed on an epitaxial layer 205 by the conventional metallization process. The interconnect structure 221 is electrically connected to the source region 218 to serve as a source electrode, the interconnect structure 223 is electrically connected to the gate structure 216 to serve as a gate electrode and the interconnect structure 225 is electrically connected to the drain region 220 to serve as a drain electrode. As a result, the fabrication of the semiconductor device 20 is completed.

In addition, a set of fourth, fifth and sixth heavily doped regions 206, 207 and 208 may be formed in the body region 212 before the above metallization process, as shown in FIG. 2E. The fourth, fifth and sixth heavily doped regions 206, 207 and 208 are adjoined sequentially from bottom to top. The fifth heavily doped region 207 has a doping concentration greater than that of the well region 204, and the fourth and sixth heavily doped regions 206 and 208 have a doping concentration similar to that of the well region 204. The fifth heavily doped region 207 has the first conductivity type, while the fourth and sixth heavily doped regions 206 and 208 have the second conductivity type. Next, the fabrication of the semiconductor device 20 is completed by the conventional metallization process, as shown in FIG. 2F.

FIGS. 3A to 3B are cross sections of another exemplary embodiment of a method for fabricating a semiconductor device 30 according to the invention. Elements in FIGS. 3A to 3B that are the same as those in FIGS. 2A to 2D are labeled with the same reference numbers as in FIGS. 2A to 2D and are not described again for brevity. Referring to FIG. 3A, a semiconductor substrate 200 is provided. Next, a well region 204 is formed in an active region A of the semiconductor substrate 200 sequentially by a doping process and a thermal diffusion process.

Afterwards, an epitaxial structure 210 of the first conductivity type is formed on the semiconductor substrate 200. In the embodiment, the epitaxial structure 210 includes multiple layers. For example, the epitaxial structure 210 includes a plurality of epitaxial layers 205 stacked vertically. The plurality of epitaxial layers 205 may be formed by an epitaxial growth process. It is noted that before forming the next epitaxial layer 205, a doping process and a thermal diffusion process are performed in the former epitaxial layer 205, such that the well region 204 in the semiconductor substrate 200 extends into the epitaxial structure 210 to serve as a drift region of the subsequently formed LDMOSFET.

In the embodiment, at least one set of the first, second and third heavily doped regions 201, 202 and 203 is formed in the well region 204. For example, after forming the corresponding well region 204 in one of the epitaxial layers 205 of the epitaxial structure 210, one set of the first, second and third heavily doped regions 201, 202 and 203 is formed in the well region 204 of the corresponding epitaxial layer 205.

In another embodiment, one set of the first, second and third heavily doped regions 201, 202 and 203 may be formed in the well region 204 corresponding to the semiconductor substrate 200 before forming the epitaxial structure 210. Next, another set of the first, second and third heavily doped regions 201, 202 and 203 may be formed in the corresponding well region 204 of each epitaxial layer 205, after forming each epitaxial layer 205 and the corresponding well region 204 therein, as shown in FIG. 3A. The plurality of sets of first, second and third heavily doped regions 201, 202 and 203 substantially align with each other vertically and a plurality of super junction structures are formed in the epitaxial structure 210 and the semiconductor substrate 200. In addition, the plurality of the sets of the first heavily doped region 201, second heavily doped region 202 and third heavily doped region 203 forms a plurality of sets of heavily doped stack region 209. The heavily doped stack regions 209 are spaced apart from each other.

Figure 3D:
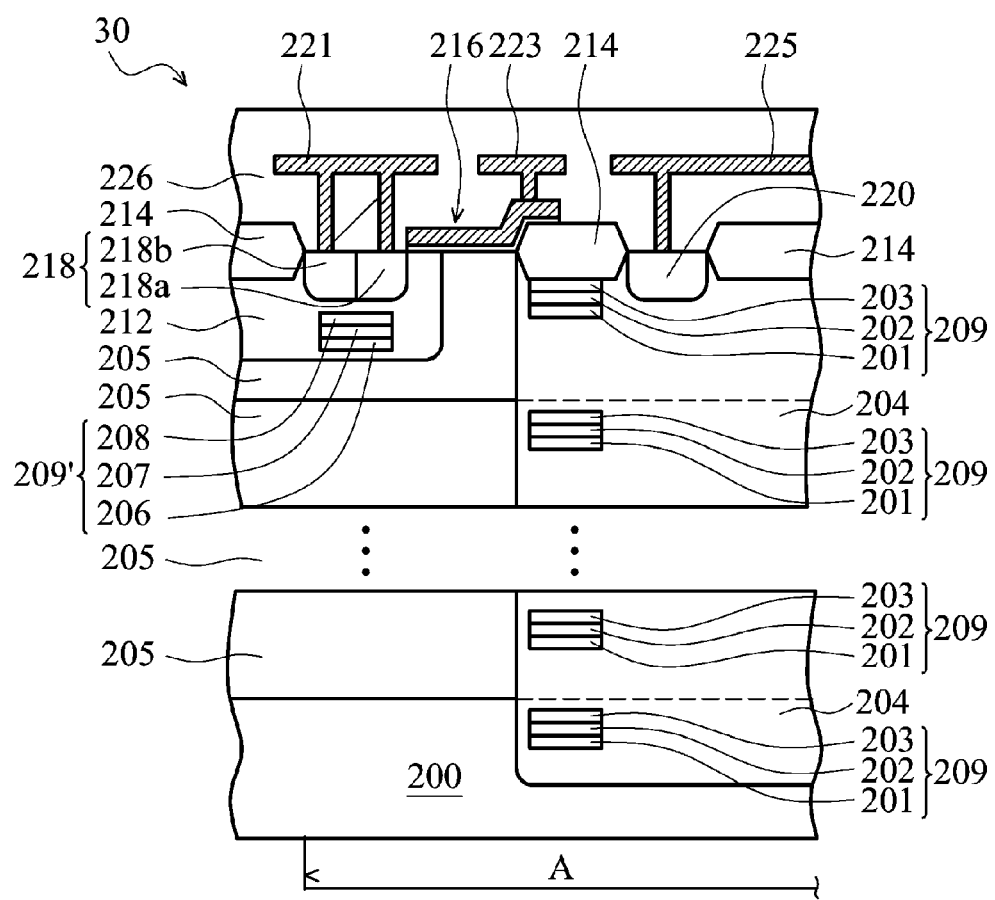

Referring to FIG. 3B, a field oxide layer 214 and a gate structure 216 may be formed on the epitaxial structure 210 and a body region 212, a source region 218 and a drain region 220 may be formed on the uppermost epitaxial layer 205 by the conventional MOS process. The field oxide layer 214 may be spaced apart from the heavily doped stack region 209. However, as shown in FIG. 3D, the heavily doped stack region 209 may directly contact the field oxide layer 214. In other words, the third heavily doped region 203 of the heavily doped stack region 209 most adjacent to the field oxide layer 214 may directly contact the field oxide layer 214. Afterwards, an interlayer dielectric (ILD) layer 226 and a plurality of interconnect structures 221, 223 and 225 therein may be formed on the epitaxial structure 210 by the conventional metallization process. As a result, fabrication of the semiconductor device 30 is completed.

In addition, a set of fourth, fifth and sixth heavily doped regions 206, 207 and 208 may be formed in the body region 212 before the above metallization process. The fourth, fifth and sixth heavily doped regions 206, 207 and 208 are adjoined sequentially from bottom to top. The fifth heavily doped region 207 has a doping concentration greater than that of the well region 204, and the fourth and sixth heavily doped regions 206 and 208 have a doping concentration similar to that of the well region 204. The fifth heavily doped region 207 has the first conductivity type, while the fourth and sixth heavily doped regions 206 and 208 have the second conductivity type. Next, the fabrication of the semiconductor device 30 is completed by the conventional metallization process, as shown in FIG. 3C.

According to the foregoing embodiments, the heavily doped region of the first conductivity type and electrically floating in the super junction structure may form a depletion region in the drift region, so that the withstand voltage of the LDMOSFET in the semiconductor device is improved. Moreover, the heavily doped region of the second conductivity type in the super junction structure may provide an additional current path in the drift region, so that the on-resistance of the LDMOSFET is reduced. Additionally, according to the foregoing embodiments, the number of super junction structures stacked vertically in the drift region may be controlled to further improve the withstand voltage of the LDMOSFET while preventing the on-resistance of the LDMOSFET from increasing. In addition, since the heavily doped regions of the second conductivity type are formed at two sides of the heavily doped region of the first conductivity type in the embodiments, the semiconductor device may provide more current paths and effectively distribute the current to prevent the current from being excessively concentrated in one portion of the drift region, which in turn prevents the semiconductor device from being damaged.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
a semiconductor substrate having a first conductivity type;
an epitaxial structure of the first conductivity type disposed over the semiconductor substrate;
a well region of a second conductivity type formed in the epitaxial structure and the semiconductor substrate, wherein the second conductivity type is opposite to the first conductivity type;
a drain region and a source region respectively formed in the epitaxial structure inside and outside of the well region;
at least one set of first, second and third heavily doped regions formed in the well region between source and drain regions, wherein the first, second and third heavily doped regions are adjoined sequentially from bottom to top and the second heavily doped region has a doping concentration greater than that of the well region, and the first and third heavily doped regions have a doping concentration similar to that of the well region, wherein the second heavily doped region has the first conductivity type, while the first and third heavily doped regions have the second conductivity type; and
a gate structure disposed over the epitaxial structure.

2. The semiconductor device as claimed in claim 1, wherein the second heavily doped region is electrically floating.

3. The semiconductor device as claimed in claim 1, wherein the epitaxial structure is composed of a single epitaxial layer and the set of first, second and third heavily doped regions is formed in the well region corresponding to the epitaxial layer or the semiconductor substrate.

4. The semiconductor device as claimed in claim 1, further comprising two sets of first, second and third heavily doped regions, wherein the epitaxial structure is composed of a single epitaxial layer and the two sets of first, second and third heavily doped regions are respectively formed in the well region corresponding to the epitaxial layer and the semiconductor substrate.

5. The semiconductor device as claimed in claim 1, wherein the epitaxial structure comprises a plurality of epitaxial layers stacked vertically and the set of first, second and third heavily doped regions is formed in the well region corresponding to the semiconductor substrate or one of the plurality of epitaxial layers.

6. The semiconductor device as claimed in claim 1, further comprising a plurality of sets of first, second and third heavily doped regions, wherein the epitaxial structure comprises a plurality of epitaxial layers stacked vertically and the plurality of sets of first, second and third heavily doped regions are correspondingly formed in the well region corresponding to each of the epitaxial layer and the semiconductor substrate.

7. The semiconductor device as claimed in claim 1, wherein the first conductivity type is p-type and the second conductivity type is n-type.

8. The semiconductor device as claimed in claim 1, wherein the first conductivity type is n-type and the second conductivity type is p-type.

9. The semiconductor device as claimed in claim 1, further comprising a body region of the first conductivity type formed in the epitaxial structure outside of the well region, such that the source region is in the body region.

10. The semiconductor device as claimed in claim 9, further comprising a set of fourth, fifth and sixth heavily doped regions formed in the body region, wherein the fourth, fifth and sixth heavily doped regions are adjoined sequentially from bottom to top and the fifth heavily doped region has a doping concentration greater than that of the well region, and the fourth and sixth heavily doped regions have a doping concentration similar to that of the well region, wherein the fifth heavily doped region has the first conductivity type, while the fourth and sixth heavily doped regions have the second conductivity type.

11. The semiconductor device as claimed in claim 10, wherein the first, second and third, fourth, fifth and/or sixth heavily doped regions have a rectangular shape.

12. The semiconductor device as claimed in claim 1, further comprising a field oxide layer disposed over the semiconductor substrate, wherein the field oxide layer is in contact with the third heavily doped regions most adjacent to the field oxide layer.

13. The semiconductor device as claimed in claim 1, further comprising a field oxide layer disposed over the semiconductor substrate, wherein the field oxide layer is spaced apart from the third heavily doped regions most adjacent to the field oxide layer.

* * * * *